United States Patent
Keaveney

(10) Patent No.: US 6,903,585 B2
(45) Date of Patent: Jun. 7, 2005

(54) PULSE WIDTH MODULATED COMMON MODE FEEDBACK LOOP AND METHOD FOR DIFFERENTIAL CHARGE PUMP

(75) Inventor: Michael F. Keaveney, Limerick (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/873,318

(22) Filed: Jun. 22, 2004

(65) Prior Publication Data

US 2005/0024112 A1 Feb. 3, 2005

Related U.S. Application Data

(60) Provisional application No. 60/544,439, filed on Feb. 14, 2004, and provisional application No. 60/483,411, filed on Jun. 27, 2003.

(51) Int. Cl.⁷ ............................................... H03L 7/06
(52) U.S. Cl. ..................................... 327/148; 327/172
(58) Field of Search ................................ 327/148, 157, 327/172, 173, 174, 536, 538; 331/17, 25; 375/373, 374, 376

(56) References Cited

U.S. PATENT DOCUMENTS

| | | | |
|---|---|---|---|
| 4,156,855 A | | 5/1979 | Crowley ..................... 331/1 A |
| 6,075,406 A | * | 6/2000 | Lee et al. .................... 327/538 |
| 6,111,470 A | | 8/2000 | Dufour ......................... 331/17 |
| 6,255,873 B1 | * | 7/2001 | Johnson et al. ............. 327/157 |

OTHER PUBLICATIONS

Rhee, W., "Design of High-Performance CMOS Charge Pums in Phase-Locked Loops", IEEE International Symposium on Circuits and Systems (ISCAS), 1999, vol. 2, pp. 545–548.

"An Analysis and Performance Evaluation of a Passive Filter Design Technique for Charge Pump PLL's", National Semiconductor Application Note 1001, Jul. 2001, pp. 1–8.

Byrd, et al. "A Fast Locking Scheme for PLL Frequency Synthesizers", National Semiconductor Application Note 1000, Jul. 1995, pp. 1–6.

Curtin et al., "Phase Locked Loops for High-Frequency Receivers and Transmitters-Part 3", Analog Dialogue 33–7 (1999), pp. 1–5.

Rhee et al., "A 1.1-GHz CMOS Fractional-N Frequency Synthesizer with a 3-b Third-Order Delta Sigma Modulator"; IEEE Journal of Solid-State Circuits, vol. 35, No. 10, Oct. 2000, pp 1453–1460.

Greshlshchev et al., "SiGe Clock and Data Recovery IC with Linear-Type PLL for 10-Gb/s SONET Applications"; IEEE Journal of Solid-State Circuits, vol. 35, No. 9, Sep. 2000, pp 1353–1359.

Bastos et al., "A 12-Bit Intrinsic Accuracy High-Speed CMOS DAC"; IEEE Journal of Solid-State Circuits, Vo. 33, No. 12, Dec. 1998, pp. 1959–1969.

* cited by examiner

Primary Examiner—Linh My Nguyen
(74) Attorney, Agent, or Firm—Iandiorio & Teska

(57) ABSTRACT

A pulse width modulated common mode feedback technique for a differential charge pump includes averaging the output of a differential charge pump to determine the common mode voltage; generating from the pump up and pump down pulses a set of up source pulses and down source pulses and a set of up sink pulses and down sink pulses and adjusting, in response to a difference between a reference voltage and the common mode voltage, the width of at least one of the sets of source and sink pulses to match the reference common mode voltages.

13 Claims, 4 Drawing Sheets

PULSE WIDTH MODULATED COMMON MODE FEEDBACK LOOP AND METHOD FOR DIFFERENTIAL CHARGE PUMP

RELATED APPLICATIONS

This application claims the benefit of U.S. Provisional Application No. 60/483,411 filed Jun. 27, 2003, and U.S. Provisional Application No. 60/544,439 filed Feb. 14, 2004 both incorporated by reference herein

FIELD OF THE INVENTION

This invention relates to a pulse width modulated common mode feedback loop and method for a differential charge pump.

BACKGROUND OF THE INVENTION

A common mode feedback (CMFB) loop is required to maintain the desired common mode voltage level on the output of a differential charge pump. A conventional CMFB circuit adjusts the magnitude of the output source versus sink current in order to find the correct common mode balance. In a PLL based synthesizer the charge pump output is only active for a fraction of a reference cycle, e.g. for 1 ns out of 40 ns, in order to minimize noise from the charge pump. Single ended charge pump and loop filter structures are used in conventional PLL synthesizers and so do not require CMFB. However, they suffer from relatively poor up/down charge pump mismatch which gives rise to static phase errors at the PFD inputs and cause reference spur sidebands on the PLL output spectrum.

An improved PLL synthesizer can be made with a differential charge pump, for improved up/down mismatch, and narrow output pulses, for lowest noise. A CMFB loop would be required though. Narrow charge pump output pulses are problematic with a conventional CMFB loop. Since it adjusts the magnitude of the output currents, it may need to make excessively large current (and hence PLL loop gain) changes to counter parasitic effects, such as charge injection, which may be of similar magnitude to the charge delivered by the narrow output current pulses. A change in loop gain can cause changes in loop dynamics resulting in less than optimum lock times and even instability.

BRIEF SUMMARY OF THE INVENTION

It is therefore an object of this invention to provide a pulse width modulated common mode feedback loop and method for a differential charge pump.

It is a further object of this invention to provide such an improved pulse width modulated common mode feedback loop and method which functions independently so that its noise is common mode to the associated phase frequency detector and has little impact on output phase noise of a PLL for example.

It is a further object of this invention to provide such an improved pulse width modulated common mode feedback loop and method which controls the common mode level by adjusting the width not magnitude of the charge pulses so there is no net increase in charge pump current.

It is a further object of this invention to provide such an improved pulse width modulated common mode feedback loop and method which adjusts pulse width by varying the trailing edge of the pulses so that the leading edges are not interfered with and phase error information carried by the leading edges remains intact.

It is a further object of this invention to provide such an improved pulse width modulated common mode feedback loop and method in which both the up and down pulse trailing edges are adjusted together and by the same amount so the common mode operation is independent of the associated circuitry, e.g. PLL so that the differential output is not disrupted.

The invention results from the realization that a common mode feedback function can be combined with a differential charge pump such as in a PLL to obtain the benefits of a differential charge pump but without effecting the phase of the PLL by adjusting the width not the magnitude of the charge pulses to control the common mode voltage and the further realization that by adjusting the trailing edge and not the leading edge, phase error information can be preserved and that by adjusting both the up and down pulses in a set (source or sink) together and by the same amount independent action is assured.

The subject invention, however, in other embodiments, need not achieve all these objectives and the claims hereof should not be limited to structures or methods capable of achieving these objectives.

This invention features a pulse width modulated common mode feedback loop for a differential charge pump including an averaging circuit responsive to the output of a differential charge pump to determine the common mode voltage. A pulse width modulating system responsive to pump up pulses and pump down pulses produces a set of up source pulses and down source pulses and a set of up sink pulses and down sink pulses. A differential amplifier responds to a difference between the common mode voltage and a reference voltage to enable the pulse width system to adjust the width of at least one of the sets of source and sink pulses to match the reference and common mode voltages.

In a preferred embodiment the differential amplifier may enable the pulse width modulation system to stretch one of the sets of source and sink pulses. It may enable the pulse width modulation system to narrow one of the sets of source and sink pulses. It may enable the pulse width modulation system to stretch one and narrow the other of the sets of source and sink pulses. The pulse width modulation system may include a first source pulse width modulation circuit for generating the up and down source pulses and a second sink pulse width modulation circuit for generating the up and down sink pulses. The trailing edges of the source and sink pulses produced by the pulse width modulation system may be adjusted and the leading edges fixed relative to the pump up and pump down pulses. Each pulse width modulation circuit may include an up delay circuit and a down delay circuit for adjusting the trailing edge of the source/sink pulses, and a current mirror responsive to the differential amplifier for providing the same current to both delay circuits to adjust the up and down source/sink pulses.

The invention also features a pulse width modulated common mode feedback method for a differential charge pump including averaging the output of a differential charge pump to determine the common mode voltage and generating from pump up and pump down pulses a set of up source pulses and down source pulses and a set of up sink pulses and down sink pulses. In response to a difference between a reference voltage and a common mode voltage the width of as least one of the sets of source and sink pulses is adjusted in order to match the reference and common mode voltages.

The invention also features a pulse width modulated common mode feedback method for a differential charge pump including detecting a common mode error between the charge pump output common mode voltage and a common mode reference voltage level, generating from pump up and pump down pulses a set of up source pulses and down source pulses and a set of up sink pulses and down sink pulses, and adjusting in response to the common mode error, the width of at least one of the sets of source and sink pulses to match the reference voltage and the common mode voltage.

The invention also features a pulse width modulated common mode feedback loop for a differential charge pump including a common mode error detect circuit responsive to the output of a differential charge pump and a common mode reference to determine the common mode error. A pulse width modulating system is responsive to pump up pulses and pump down pulses to produce a set of up source pulses and down source pulses, and a set of up sink pulses and down sink pulses and is responsive to the common mode error detect circuit to adjust the width of at least one of the sets of source and sink pulses to minimize the common mode error.

In a preferred embodiment the common mode detect circuit may include an averaging circuit. It may include a summing circuit. It may include a differential amplifier to produce an error signal proportional to the common mode voltage of the differential charge pump output and a reference common mode voltage.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
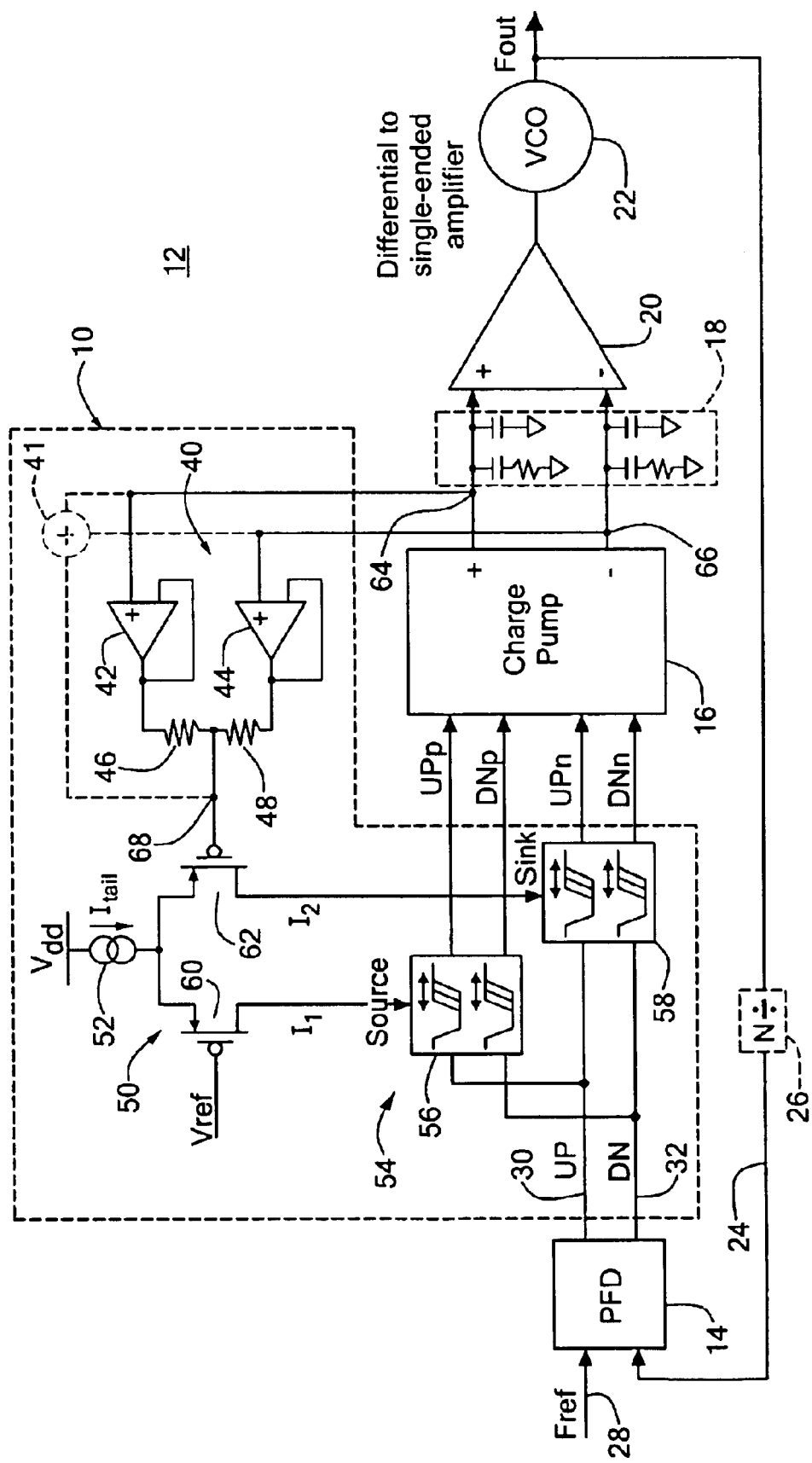
FIG. 1 is a schematic block diagram of a PLL including a pulse width modulated common mode feedback loop for a differential charge pump according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a common mode feedback loop 10 in a phase lock loop 12 which also includes phase frequency detector 14, differential charge pump 16, loop filter 18, differential to single ended amplifier 20 and voltage controlled oscillator VCO 22. Phase lock loop 12 operates in a conventional fashion. The output of VCO 22 is fed back along feedback path 24 to one input of phase frequency detector 14. The feedback may include, as is often the case, divide by N circuit 26. The other input 28 to phase frequency detector 14 is a reference frequency $f_{ref}$, any difference between $f_{ref}$ on 28 and the frequency of the feedback signal on line 24 causes a set of up/down signals to be produced on lines 30 and 32 which are submitted through common mode feedback loop 10 to eventually drive differential charge pump 16 to produce an output which raises or lowers the voltage on loop filter 18 that is provided through amplifier 20 to VCO 22. Depending upon the magnitude and polarity of the phase difference between the inputs 24 and 28 to phase detector 14, there will be an increase or decrease in the voltage provided to voltage control oscillator 22 which will in turn increase or decrease the frequency of the output signal which is fed back on line 24 until the two inputs to frequency detector 14 are balanced.

Common mode feedback loop 10 includes a common mode error detector circuit e.g. averaging circuit 40 which has two buffer amplifiers 42, 44 and averaging resistors 46 and 48. The buffer amplifiers may be omitted if the resistors are large enough not to significantly load the loop filter. Also included in common mode feedback loop 10 is differential amplifier 50 and pulse width modulation system 54 which is shown in FIG. 1 as including two pulse width modulations circuits: a pulse width modulation source circuit 56 and a pulse width modulation sink circuit 58. Differential amplifier 50 in this particular case is simply a gm (transconductance) stage with a PMOS differential pair (transistors 60 and 62) and current source 52 providing a tail current, $I_t$, to the differential pair. The averaging circuit 40 and differential amplifier 50 together form a common mode error detector with differential output current ($I_2$-$I_1$) proportional to the common mode error.

In operation, averaging circuit 40 senses the voltage at points 64 and 66 across loop filter 18 and forms an average of those voltages which it provides at 68 to the gate of transistor 62. The gate of transistor 60 already has a common mode reference voltage on it, for example two volts. Current source 52 is connected to power supply $V_{dd}$ and provides the tail current, $I_t$, e.g. 200 micro amps to differential pair (60 and 62). When the average common mode voltage at gate 68 of transistor 62 is the same as the reference voltage on the gate of transistor 60, the tail current, $I_t$, from current source 52 splits evenly. $I_1$ flowing from transistor 60 to pulse width source circuit 56 and 12 flowing from transistor 62 to pulse width sink circuit 58 are each equal to $I_t/2$.

For example, when the voltages at points 64 and 66 are 3 volts and 1 volt, respectively, their total is 4 volts, their average is 2 volts and so 2 volts appears at the output 68. Thus the gate of transistor 62 and the gate of transistor 60 have the same voltages and the currents $I_1$ and $I_2$ will be balanced. However if these voltages begin to change so that, for example, points 64 and 66 are at 3.5v and 1.5v it can be seen that the difference voltage is still two volts, 3.5−1.5=2. So there is no change in the PLL loop and the VCO 22 undergoes no increase or decrease in frequency. But the common mode voltage has moved. For now the total of the two voltages at point 64 and 66 is 5 volts and the average is 2.5v, when this 2.5v appears at gate 68 of transistor 62, gate 68 now has a greater voltage on it than the 2 volts on the gate of transistor 60. The higher gate voltage on transistor 62 produces a lower current to pulse width sink circuit 58 while the higher current will flow to pulse width modulating source circuit 56. For example, $I_1$ may be increased to 150 micro amps and $I_2$ will then be only 50 micro amps. This causes the UP and DN pulses on lines 30, 32 to produce stretched counterparts $UP_p$ and $DN_p$ from pulse width modulating source circuit 56 and narrowed counter parts $UP_n$, $DN_n$ from pulse width modulating sink circuit 58. Wider PMOS current pulses increase the common mode level and wider NMOS pulses will decrease the level. As will be explained hereinafter the common mode feedback signal current $I_1$ and $I_2$ are used to delay the trailing edge of the pulses from phase frequency detector 14 to the PMOS and NMOS current switches in differential charge pump 16. It does not effect the leading edge of the pulses and so the phase detection being effected by the phase lock loop is not effected. Because both the up and down trailing edges are adjusted together and by the same amount the common mode feedback look 10 acts independently of the phase lock loop 12.

Figure 2:
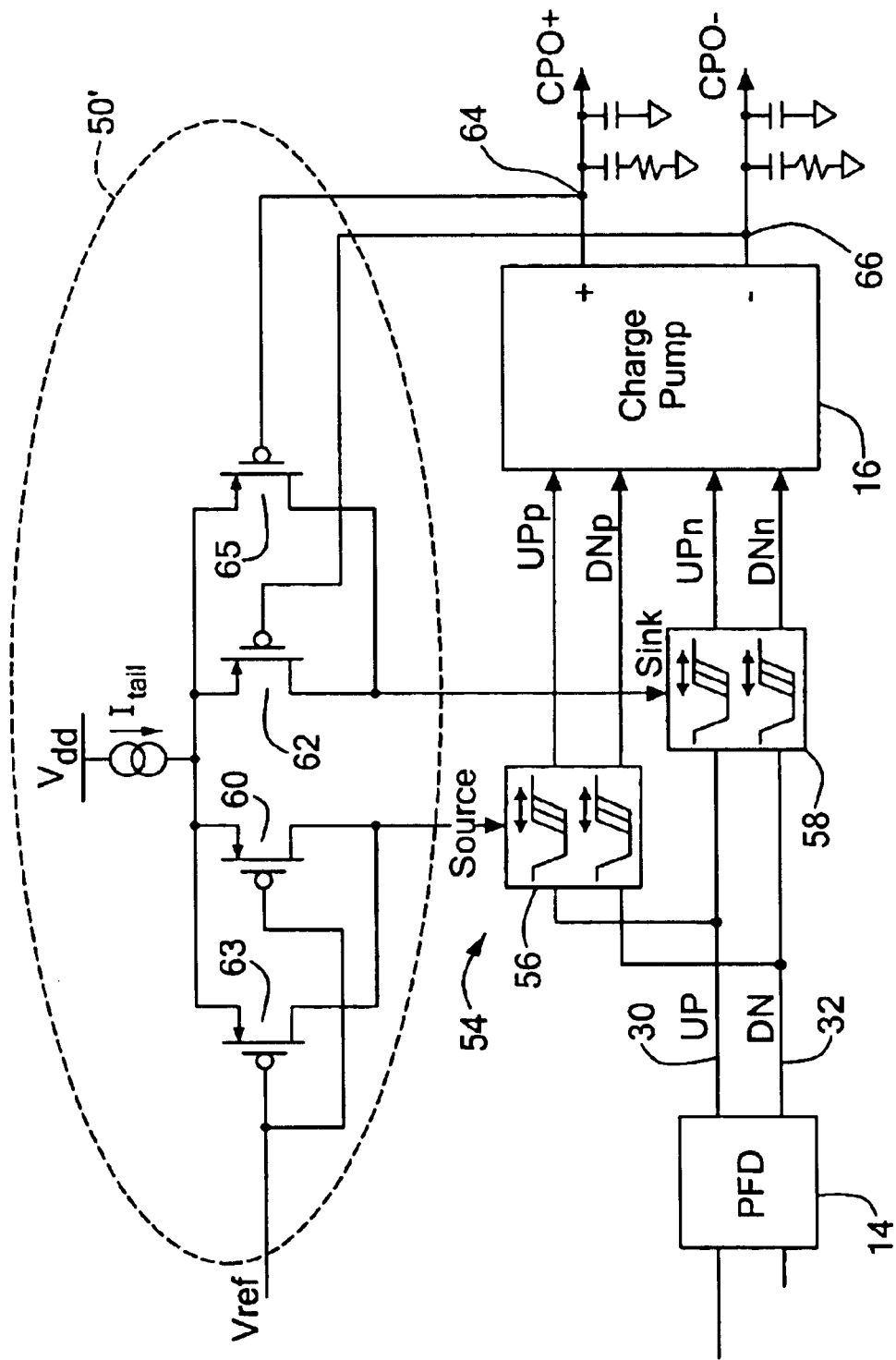
FIG. 2 is a schematic block diagram showing an example of a common mode error detection which may be employed in the PLL shown in FIG. 1.

While averaging circuit 40 works well to provide a function of the common mode voltage to differential amplifier this is not the only common mode error detector circuit that can be used to drive the common mode feedback loop. For example, averaging circuit 40 could be replaced by summing current 41 shown in phantom in FIG. 1. Summing circuit 41 similarly receives it input from points 64 and 66 and provides its output to gate 68 but now the reference voltage provided to the gate of transistor 60 will be twice the desired common mode voltage. In another approach the averaging could be done, not by an averaging circuit such as 40, but by combining the averaging function into differential amplifier 50. In this example, if the voltage swing between points 64 and 66 is small enough to remain within the limited linear input range of differential pair 50, then common mode error detector circuit 40 can be simplified to differential circuit 50', FIG. 2, where like parts have been given like numbers. In this example, differential circuit 50' includes four identical transistors 60, 62, 63, and 65.

Figure 3:
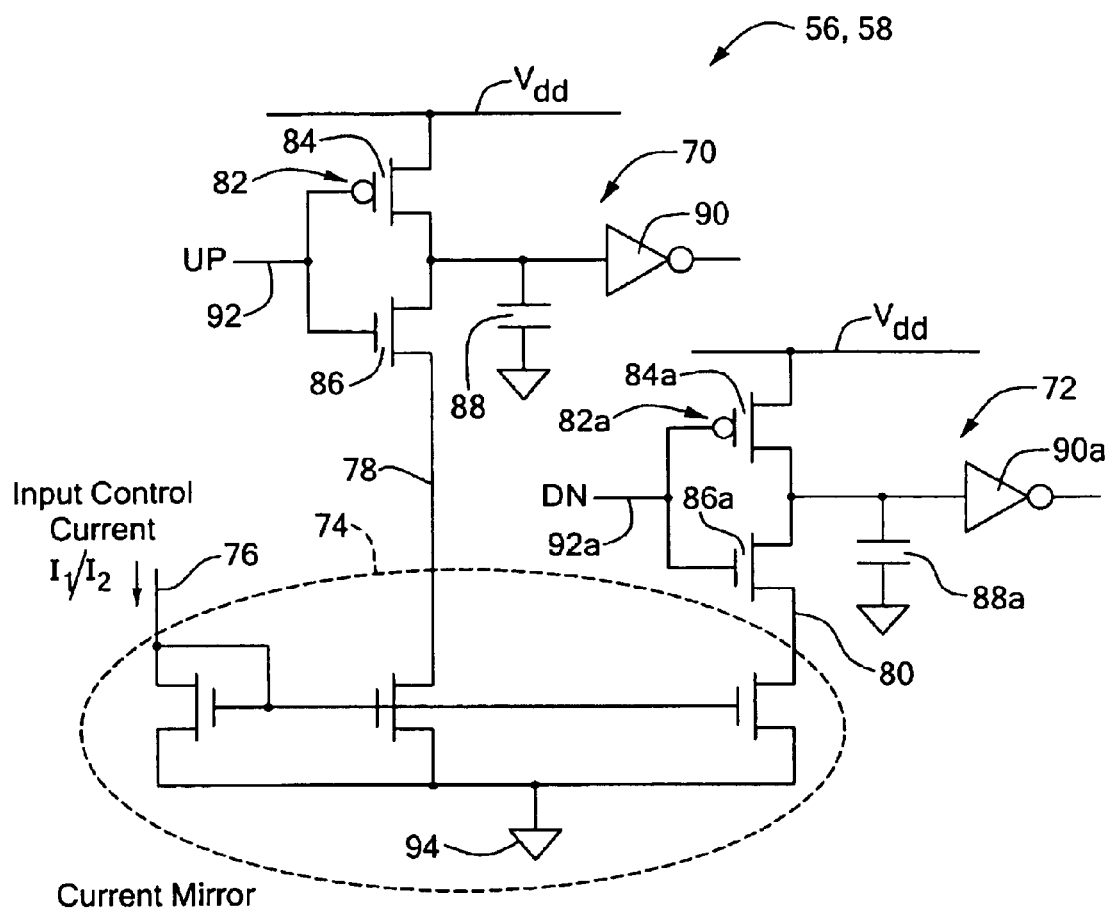
FIG. 3 is a more detailed schematic diagram of the pulse width modulating circuit of FIG. 1.

Each of the pulse width modulating circuits, the source 56 and the sink 58 are the same and are shown in greater detail in FIG. 3. There is an up delay circuit 70 and a down delay circuit 72 and current mirror 74. Current mirror 74 ensures that the input control current $I_1$ or $I_2$ which is introduced to the current mirror at 76 is exactly mirrored on lines 78 and 80 to the respective delay circuits 70 and 72. Each of the delay circuits is exactly the same and will be explained with reference to up delay circuit 70, it being noted that down delay circuit 72 is identical. First inverter 82 includes PMOS switch 84 and NMOS switch 86, there is a capacitor 88 and a second inverter 90. Capacitor 88 may be just the parasitic capacitance of the inverter 90 input. These pulse width modulating circuits are basically those two inverters which provide a fast leading edge and a current controlled trailing edge.

When the input on line 92 goes low PMOS 84 pulls up and turns on quickly and charges the capacitor 88 to supply voltage $V_{dd}$. The rising voltage on capacitor 88 quickly turns the output of inverter 90 low. When the input at 92 goes high PMOS switch 84 is turned off and NMOS switch 86 is turned on. Capacitor 88 is now discharged through line 78 to ground 94. The discharge time is proportional to the capacitance divided by the current. So the smaller the current coming from the capacitor the longer the discharge time. When the voltage on the capacitor 88 drops below a trigger voltage for the following inverter 90 that inverter output snaps high. Delay circuit 72 where like parts have been given like numbers accompanied by lower case a operates in the same way.

Figure 4:
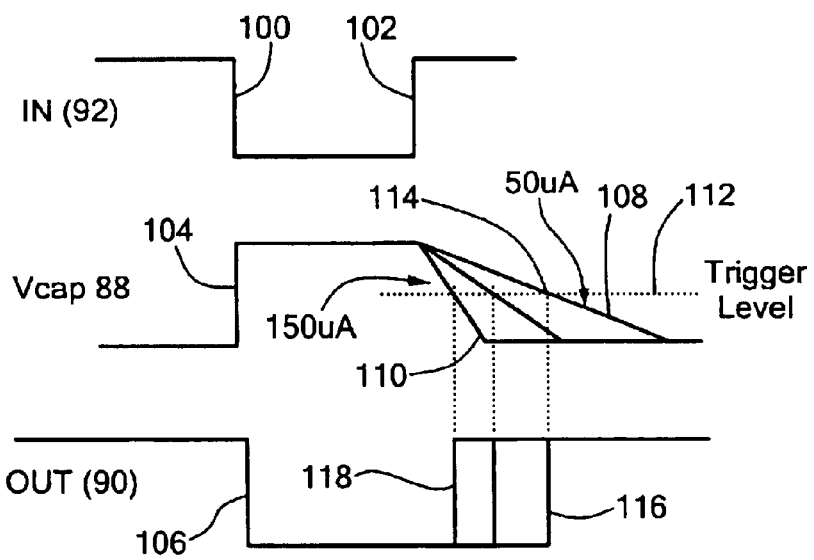
FIG. 4 is a timing diagram showing pulse width modulation by the pulse width modulating circuit of FIG. 3.

This operation can be seen in FIG. 4 where the input voltage on line 92 appears with its leading edge 100 and lagging edge 102. The voltage on the cap outer 88 builds up at 104 quickly after the low going leading edge 100 of the input pulse appears. The output pulse from inverter 90 has a leading edge 106 slightly delayed from this. This leading edge delay is fixed which means that there is no interference with the phase detection function of the phase lock loop. However, depending upon the amount of current being discharged from capacitor 88, the ramp created may be shallower, e.g. 108 as at 50 micro amps or steeper, e.g. 110 as at 150 micro amps or somewhere in between. The trigger level 112 for inverter 90 thus establishes a trigger point earlier or later in time depending upon the slope and thus the magnitude of the current of the capacitor 88 discharge. At 50 micro amps for example, the trigger point occurs at 114 giving a modified pulse width at 116, whereas at 150 micro amps the pulse width is only at 118.

Figures 5, 6:
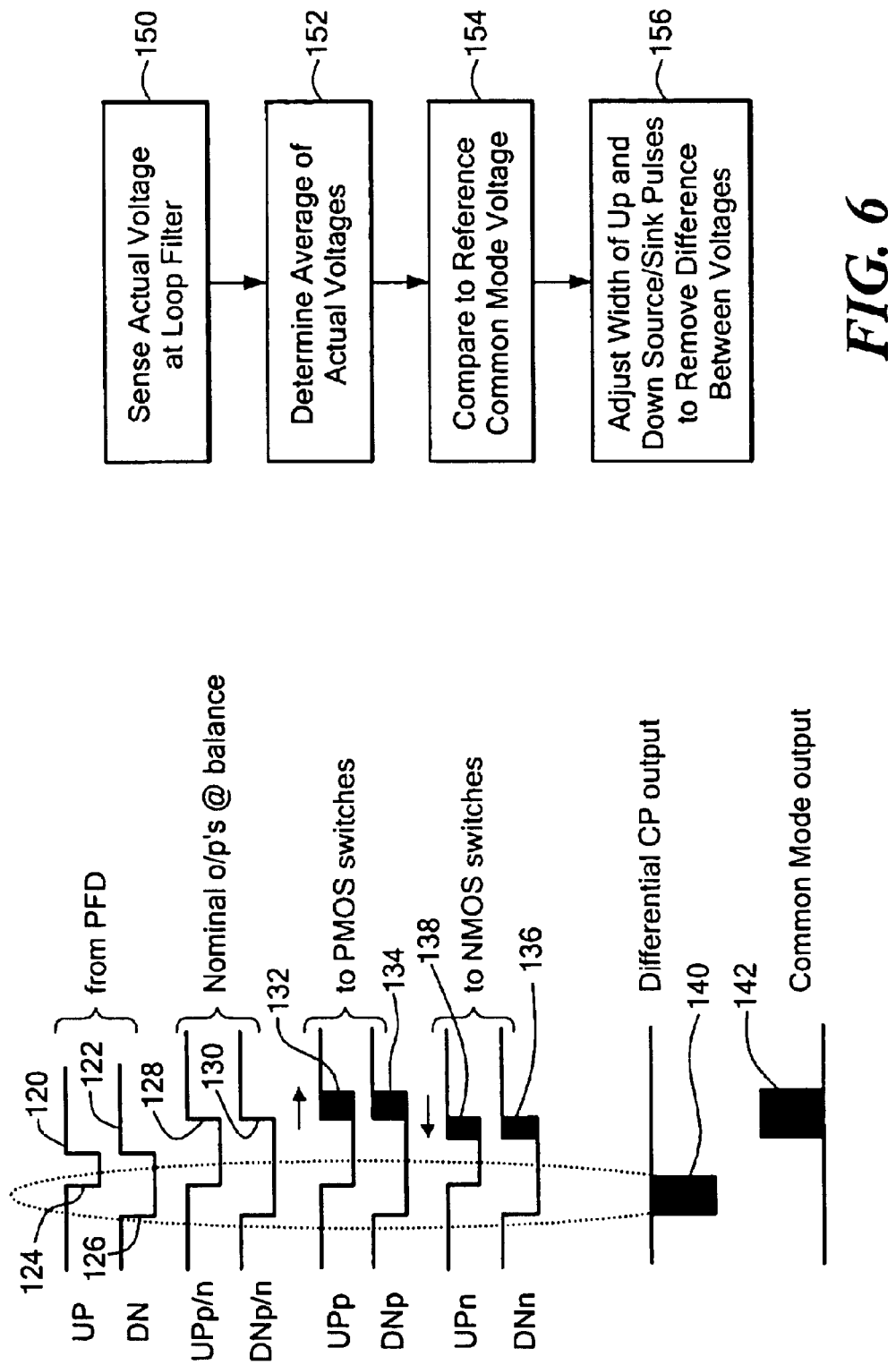
FIG. 5 is a timing diagram showing how pulse width modulation effects common mode feedback adjustment independent of phase information.
FIG. 6 is a schematic block diagram of the method according to this invention.

The operation can be better understood with respect to FIG. 5 where the signals are labeled in accordance with FIG. 1. The UP and DN signals 120, 122 are the phase frequency detector 14 outputs which are input to both the pulse width modulating source circuit 56 and pulse width modulating sink circuit 58. The difference between the leading edges 124 and 126 of these pulses is what contains the phase information for the phase lock loop and as can be seen by looking down the waveforms in FIG. 5 the relative positions of those leading edges never change. When the common mode feedback loop is perfectly in balance, that is the sensed common mode voltage is the same as the common mode reference voltage, the currents $I_1$ and $I_2$ are equal and the trailing edges 128 and 130 are aligned.

However, in response to a low common mode voltage level the $UP_p$ and $DN_p$ pulses will have their lagging edges 132, 134 stretched and by the same amount, while the $UP_n$ and $DN_n$ pulses will have their leading edges 136 and 138 shortened or narrowed. Since the leading edges 126, 124 have been preserved throughout all of the signals the phase information from the phase frequency detector 14 shown at 140 remains intact while the shift in the lagging edges 132, 134 with respect to the lagging edges of the $UP_n$ and $DN_n$ pulses results in a common mode adjustment signal 142, which is independent of and not interfering with the pulse produced by the difference illustrated by pulse 140. Since the correction signal from the common mode error detector acts equally on both UP and DOWN signals from the phase detector, noise from the common mode error detect circuitry causes little degradation to output phase noise.

This invention contemplates this technique of independently adjusting the common mode voltage without interfering with the phase information in the phase lock loop regardless of the particular hardware involved so that a differential charge pump with its attendant advantages may be used in a phase lock loop to drive the VCO. The method according to this invention essentially involves sensing the actual voltage at the loop filter 150, FIG. 6, then determining the average of the actual voltages 152 and comparing the actual voltage to a reference common mode voltage 154 after which the width of one or both of the source/sink pulses are adjusted 156 to remove any difference between the sensed common mode voltage and the reference common mode voltage.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A pulse width modulated common mode feedback loop for a differential charge pump comprising:
   an averaging circuit responsive to an output of the differential charge pump to determine a common mode voltage;
   a pulse width modulating system responsive to pump up pulses and pump down pulses to produce a set of up source pulses and down source pulses, and a set of up sink pulses and down sink pulses; and
   a differential amplifier responsive to a difference between the common mode voltage and a reference voltage to enable said pulse width system to adjust the width of at least one of said sets of source and sink pulses to match the reference and common mode voltages.

2. The pulse width modulated common mode feedback loop of claim 1 in which said differential amplifier enables said pulse width modulation system to stretch one of said sets of source and sink pulses.

3. The pulse width modulated common mode feedback loop of claim 1 in which said differential amplifier enables said pulse width modulation system to narrow one of said sets of source and sink pulses.

4. The pulse width modulated common mode feedback loop of claim 1 in which said differential amplifier enables said pulse width modulation system to stretch one and narrow the other of said sets of source and sink pulses.

5. The pulse width modulated common mode feedback loop of claim 1 in which said pulse width modulation system includes a first source pulse width modulation circuit for generating said up and down source pulses and a second sink pulse width modulation circuit for generating said up and down sink pulses.

6. The pulse width modulated common mode feedback loop of claim 1 in which the trailing edges of said source and sink pulses produced by said pulse width modulation system are adjusted and the leading edges are fixed relative to said pump up and pump down pulses.

7. The pulse width modulated common mode feedback loop of claim 5 in which said pulse width modulation circuit includes an up delay circuit and a down delay circuit for adjusting the trailing edge of said source/sink pulses, and a current mirror responsive to said differential amplifier for providing the same current to both delay circuits to adjust the up and down source/sink pulses.

8. A pulse width modulated common mode feedback method for a differential charge pump comprising:
   averaging output of the differential charge pump to determine a common mode voltage;
   generating from pump up and pump down pulses a set of up source pulses and down source pulses and a set of up sink pulses and down sink pulses; and
   adjusting in response to a difference between a reference voltage and the common mode voltage, the width of at least one of said sets of source and sink pulses to match the reference and common mode voltages.

9. A pulse width modulated common mode feedback method for a differential charge pump comprising:
   detecting a common mode error between a differential charge pump output common mode voltage and a common mode reference voltage level;
   generating from pump up and pump down pulses a set of up source pulses and down source pulses and a set of up sink pulses and down sink pulses; and
   adjusting in response to the common mode error, the width of at least one of said sets of source and sink pulses to match said reference voltage and common mode voltage.

10. A pulse width modulated common mode feedback loop for a differential charge pump comprising:
    a common mode error detect circuit responsive to an output of the differential charge pump and a common mode reference to determine the common mode error;
    a pulse width modulating system responsive to pump up pulses and pump down pulses to produce a set of up source pulses and down source pulses, and a set of up sink pulses and down sink pulses; and responsive to the common mode error detect circuit to adjust the width of at least one of said sets of source and sink pulses to minimize the common mode error.

11. The pulse width modulated common mode feedback loop for a differential charge pump of claim 10 in which said common mode detect circuit includes an averaging circuit.

12. The pulse width modulated common mode feedback loop for a differential charge pump of claim 10 in which said common mode detect circuit includes a summing circuit.

13. The pulse width modulated common mode feedback loop for a differential charge pump of claim 10 in which said common mode detect circuit includes a differential amplifier to produce an error signal proportional to the common mode voltage of the differential charge pump output and a reference common mode voltage.

* * * * *